(12) United States Patent
Kim et al.

(10) Patent No.: US 7,364,967 B2
(45) Date of Patent: Apr. 29, 2008

(54) METHODS OF FORMING STORAGE CAPACITORS FOR SEMICONDUCTOR DEVICES

(75) Inventors: Rak-Hwan Kim, Gyeonggi-do (KR); Young-Joo Cho, Gyeonggi-do (KR); Sung-Tae Kim, Seoul (KR); In-Sun Park, Gyeonggi-do (KR); Hyeon-Deok Lee, Seoul (KR); Hyun-Suk Lee, Gyeonggi-do (KR); Jung-Hee Chung, Seoul (KR); Hyun-Young Kim, Seoul (KR); Hyun-Seok Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 149 days.

(21) Appl. No.: 11/266,520

(22) Filed: Nov. 3, 2005

(65) Prior Publication Data

US 2006/0099760 A1 May 11, 2006

(30) Foreign Application Priority Data

Nov. 11, 2004 (KR) .................. 10-2004-0091718

(51) Int. Cl.
*H01L 21/8242* (2006.01)
(52) U.S. Cl. .................. 438/254; 438/397; 257/304; 257/E21.364; 257/E27.048

(58) Field of Classification Search ............... 257/303, 257/310, 304, 311; 438/253, 396, 254, 397
See application file for complete search history.

(56) References Cited

U.S. PATENT DOCUMENTS

| 6,177,305 B1 | 1/2001 | Hornback et al. |
| 6,677,254 B2 | 1/2004 | Narwankar et al. |
| 6,787,414 B2 * | 9/2004 | Lee .................. 438/253 |

* cited by examiner

*Primary Examiner*—Quoc Hoang
(74) *Attorney, Agent, or Firm*—Myers Bigel Sibley & Sajovec, PA

(57) ABSTRACT

Methods of forming a storage capacitor include forming an interlayer insulation layer having an opening therethrough on a semiconductor substrate, forming a contact plug in the opening, forming a molding oxide layer on the interlayer insulation layer and the contact plug, selectively removing portions of the molding oxide layer to form a recess above the contact plug, forming a titanium layer on a bottom surface and side surfaces of the recess, forming a titanium nitride layer on the titanium layer, and forming a titanium oxide nitride layer on the titanium nitride layer. A storage capacitor includes a semiconductor substrate, an interlayer insulation layer having a contact plug therein on the substrate, and a storage electrode on the contact plug including a titanium silicide layer, a titanium nitride layer on the titanium silicide layer, and a titanium oxide nitride layer on the titanium nitride layer.

10 Claims, 15 Drawing Sheets

METHODS OF FORMING STORAGE CAPACITORS FOR SEMICONDUCTOR DEVICES

CROSS-REFERENCE TO RELATED APPLICATION

This application claims priority under 35 U.S.C. § 119 to Korean Patent Application No. 10-2004-0091718 filed on Nov. 11, 2004, the disclosure of which is hereby incorporated herein by reference as if set forth in its entirety.

FIELD OF THE INVENTION

The present invention relates to semiconductor devices, and more particularly, to storage capacitors for use in semiconductor memory devices, and methods of forming the same.

BACKGROUND

A memory cell of semiconductor memory device such as a DRAM (Dynamic Random Access Memory) cell may include a transistor and a storage capacitor. When the size of the memory cell is scaled down to obtain a highly integrated DRAM, the area of a semiconductor substrate occupied by the storage capacitor may be reduced. This may reduce the capacitance of a typical storage capacitor, such as a capacitor having a two-dimensional planar structure.

When the capacitance of a storage capacitor is reduced, the signal/noise (S/N) ratio may be lowered, and soft errors may be caused by alpha ($\alpha$) particles. Thus, the capacitance of storage capacitors should be maintained at an acceptable level even in highly integrated DRAM cells.

Various approaches have been proposed to increase the capacitance of storage capacitors, including reducing the thickness of the dielectric film, forming the dielectric film of a material having a large dielectric constant, and/or enlarging the operational area of the storage capacitor.

For example, to enlarge the operational area of a storage capacitor, storage capacitor design has evolved from a planar capacitor structure to three-dimensional stack-type and/or trench-type capacitor structures. In the case of stack-type capacitor structures, cylinder-type capacitors and/or fin-type capacitor structures have been developed to increase the area of the storage electrode.

When using a dielectric material having a high dielectric constant, such as, for example, $Ta_2O_5$, $Al_2O_3$, and/or $HfO_2$, as a dielectric film of storage capacitor, the quality of the interface of the dielectric with a polysilicon electrode may decrease. In particular, the quality of the interface of the dielectric with a polysilicon electrode may decrease as the dielectric constant increases. Also, if the thickness of the dielectric film is reduced, leakage current may increase due to tunneling effects. To control such leakage current, a layer having a low dielectric constant, such as a silicon oxide nitride layer (SiON), may be added between a polysilicon electrode and a dielectric film, but this may result in a decrease of overall capacitance. Thus, it has been proposed to employ, as an electrode, a metal having a high work function, such as TiN, Pt, etc., instead of using a polysilicon electrode.

For example, in a capacitor using $Al_2O_3$ or $HfO_2$ as a dielectric film, an MIS (Metal Insulator Silicon) structure has been formed in which polysilicon (poly-Si) is used as a storage electrode (i.e., a lower electrode), and a metal layer is used as a plate electrode (i.e., an upper electrode). In addition, research and development for an MIM (Metal Insulator Metal) structure in which both the storage electrode and the plate electrode include metal layers has been actively pursued.

When a TiN layer having a high work function is used as a storage electrode that is electrically connected with a contact plug formed of a silicon-containing material such as polysilicon, the ohmic contact resistance between the electrode and the contact plug may increase. Thus, a metal silicide layer may be formed between the contact plug and the storage electrode, so as to reduce the ohmic contact resistance therebetween.

A metal silicide layer may serve as an ohmic layer that provides an interface between a silicon substrate and an upper metal layer, or between the storage electrode and a contact plug formed on a silicon substrate. Further, the metal silicide layer may serve as a diffusion barrier layer to prevent diffusion of materials between a metal layer and an underlying semiconductor region, or between two metal layers in a multimetal system.

For example, a metal silicide layer may be formed of $TiSi_2$ or a group VIII silicide (e.g., $PtSi_2$, $PdSi_2$, $CoSi_2$, $NiSi_2$, etc.). In particular, $TiSi_2$ may be used widely in semiconductor devices under the 0.25 µm level.

A known method of manufacturing a capacitor in which $TiSi_2$ is used as a storage electrode is described as follows.

FIGS. 1A to 1H are sectional views illustrating the fabrication of a storage capacitor according to conventional methods.

As shown in FIG. 1A, a first interlayer insulation layer 12 is formed on a semiconductor substrate 10 and/or on a conductive region 11 formed on the semiconductor substrate 10. Portions of the interlayer insulation layer 12 are selectively removed to form a contact hole 13 which exposes portions of the semiconductor substrate 10 and/or the conductive region 11. The conductive region 11, which may be a conductively doped region in the semiconductor substrate 10, may, for example, form a source/drain region of a transistor of a memory cell.

As shown in FIG. 1B, a layer of polysilicon doped with conductive impurities is formed over the face of the semiconductor substrate including the contact hole 13. The polysilicon is partially removed to expose the first interlayer insulation layer 12, thereby forming a contact plug 14 within the contact hole 13.

With reference to FIG. 1C, an etch stop layer 15, a molding oxide layer 16 and a hard mask layer 17 are sequentially formed on the contact plug 14 and the first interlayer insulation layer 12.

Referring to FIG. 1D, a photoresist pattern (not shown) is formed on the hard mask layer 17 and patterned using a photolithography process. Portions of the hard mask layer 17 may be selectively removed using the photoresist pattern as an etch mask. The photoresist pattern is removed, and portions of the molding oxide layer 16 and the etch stop layer 15 are selectively etched using the hard mask layer 17 as an etch mask, to thereby form a recess 18 that exposes the contact plug 14.

As shown in FIG. 1E, a titanium layer 23 and a titanium nitride layer 24 are deposited on the side faces and the lower face of the recess 18 and on an upper part of the molding oxide layer 16 to form a storage electrode 19. Portions of the titanium layer 23 formed on the lower face of the recess 18 in which the contact plug 14 is exposed may react with silicon in the contact plug 14 to form a titanium silicide layer 23a.

As shown in FIG. 1F, a sacrificial oxide layer 26 is formed to fill the recess 18. The hard mask layer 17 and portions of the sacrificial oxide layer 26 are then removed. For example, the wafer may be planarized by a chemical mechanical polishing (CMP) or an etch-back process, to separate adjacent nodes of the storage electrode 19.

Referring to FIG. 1G, the sacrificial oxide layer 26 and the molding oxide layer 16 formed in the periphery of the storage electrode 19 may be removed, for example, by using an etching solution. The etching solution for removing the sacrificial oxide layer 26 and the molding oxide layer 16 may include a mixed buffer solution of HF and $NH_4F$, e.g., an LAL solution in which $HF:NH_4F$ are mixed at a ratio of about 1:6~1:10. As the buffer solution contains a strong acid such as HF, portions of the titanium layer 23 of the storage electrode 19 exposed in removing the sacrificial oxide layer 26 and the molding oxide layer may also be removed by the buffer solution. Moreover, in removing the sacrificial oxide layer 26 and the molding oxide layer 16, the buffer solution may penetrate through the titanium nitride layer 24, which may cause damage to the titanium silicide layer 23a provided in a lower part of the titanium nitride layer 24 and/or to the contact plug 14.

With reference to FIG. 1H, a dielectric layer 20 and a plate electrode 21 are formed on the storage electrode 19, thus forming a storage capacitor 30. A second interlayer insulation layer (not shown) may be formed to bury the storage capacitor 30.

Some conventional methods of forming a storage capacitor may employ an MIM structure in which a storage electrode 19 and/or a plate electrode 21 is formed of a metal such as titanium and/or titanium nitride. A metal silicide layer may be formed between the contact plug 14 and the storage electrode 19, which may reduce the ohmic resistance between the contact plug 14 and the storage electrode 19.

Conventional methods of forming a storage capacitor may have certain drawbacks, however. For example, in some conventional methods, a buffer solution may penetrate through the titanium nitride layer 24 when removing the sacrificial oxide layer 26 and the molding oxide layer 16, which may cause damage to the titanium silicide layer 23a in a lower part of the titanium nitride layer 24 and/or to the contact plug 14. Such damage may result, for example, in a decrease of the production yield of memory devices incorporating a conventional storage capacitor.

SUMMARY

Methods of forming a storage capacitor according to some embodiments of the invention include forming an interlayer insulation layer including an opening therethrough on a semiconductor substrate, forming a contact plug in the opening in the interlayer insulation layer, forming a molding oxide layer on the interlayer insulation layer and the contact plug, selectively removing portions of the molding oxide layer to form a recess above the contact plug, forming a titanium layer on a bottom surface and side surfaces of the recess, and forming a titanium oxide nitride layer on the titanium layer.

Methods according to embodiments of the invention may further include forming a titanium nitride layer on the titanium layer, wherein forming a forming a titanium oxide nitride layer on the titanium layer includes forming a titanium oxide nitride layer on the titanium nitride layer.

Some methods may include forming a sacrificial oxide layer on the semiconductor substrate including the recess, planarizing the semiconductor substrate to expose the molding oxide layer and thereby define a storage electrode, removing the sacrificial oxide layer and the molding oxide layer, forming a dielectric layer on the storage electrode, and forming a plate electrode on the dielectric layer.

The titanium nitride layer may have a thickness of about 300 Å, while the titanium oxide nitride layer may have a thickness of from about 10 Å to about 30 Å.

In particular embodiments, the titanium oxide nitride layer may be formed through a rapid thermal process, a plasma oxidation, a tube $O_2$ diffusion and/or an in-situ oxidation. The titanium oxide nitride layer may be formed in temperature under about 500° C.

In further embodiments of the invention, the titanium oxide nitride layer may be formed by rapidly thermal-processing the titanium nitride layer under an atmosphere of oxygen. Alternatively, the titanium oxide nitride layer may be formed by rapidly thermal-processing the titanium nitride layer under an atmosphere of nitrogen with a flow of oxygen.

In some embodiments, the titanium oxide nitride layer may be formed by a vacuum break method in which the titanium nitride layer may be formed in a vacuum state and may be exposed to the atmosphere. In particular, the titanium oxide nitride layer may be formed by exposing the titanium nitride layer in the atmosphere for about five minutes, to thereby form a titanium oxide nitride layer having a thickness of about 10 Å.

In some embodiments, forming the titanium nitride layer may include forming a first titanium nitride layer and forming the titanium oxide nitride layer may include forming a titanium oxide nitride layer on the first titanium nitride layer, and the method may further include forming a second titanium nitride layer on the titanium oxide nitride layer.

A storage capacitor according to some embodiments of the invention includes a semiconductor substrate, an interlayer insulation layer on the semiconductor substrate and having a contact plug therein, and a storage electrode on the contact plug. The storage electrode includes a titanium silicide layer on the contact plug, a titanium nitride layer on the titanium silicide layer, and a titanium oxide nitride layer on the titanium nitride layer.

A storage capacitor may further include a dielectric layer on the storage electrode, and a plate electrode on the dielectric layer. The storage electrode may be cylindrical.

In particular embodiments, the titanium nitride layer may have thickness of about 300 Å, while the titanium oxide nitride layer may have thickness of from about 10 Å to about 30 Å.

In some embodiments, the capacitor may include a second titanium nitride layer on the titanium oxide nitride layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
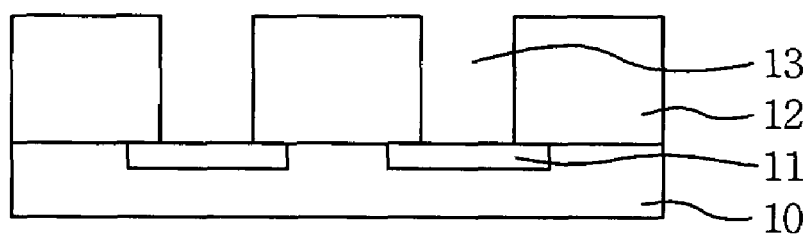
FIGS. 1A to 1H are sectional views illustrating conventional methods of forming a storage capacitor.
Figure 1B:
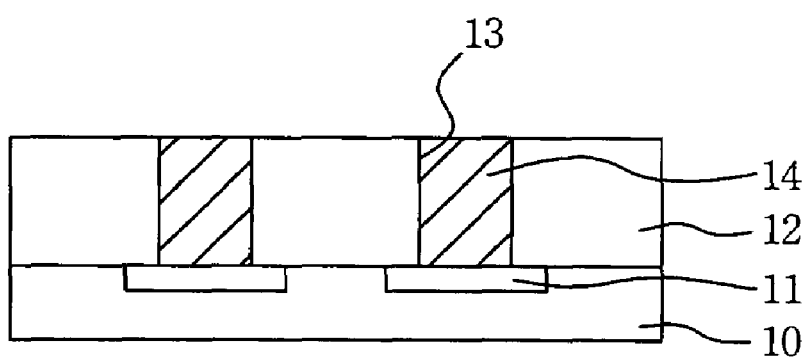
Figure 1C:
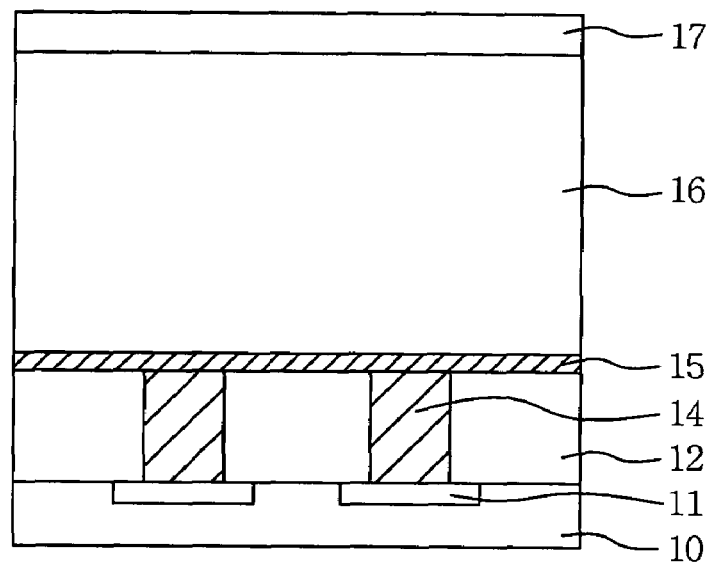
Figure 1D:
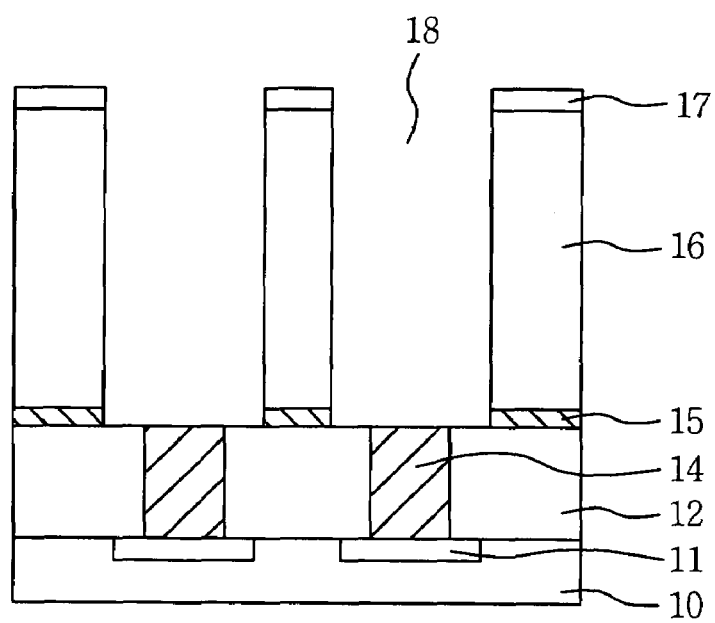
Figure 1E:
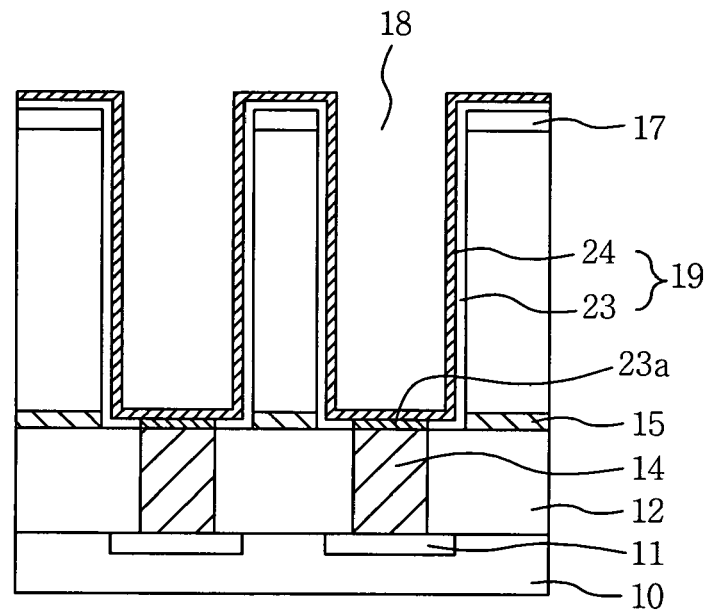
Figure 1F:
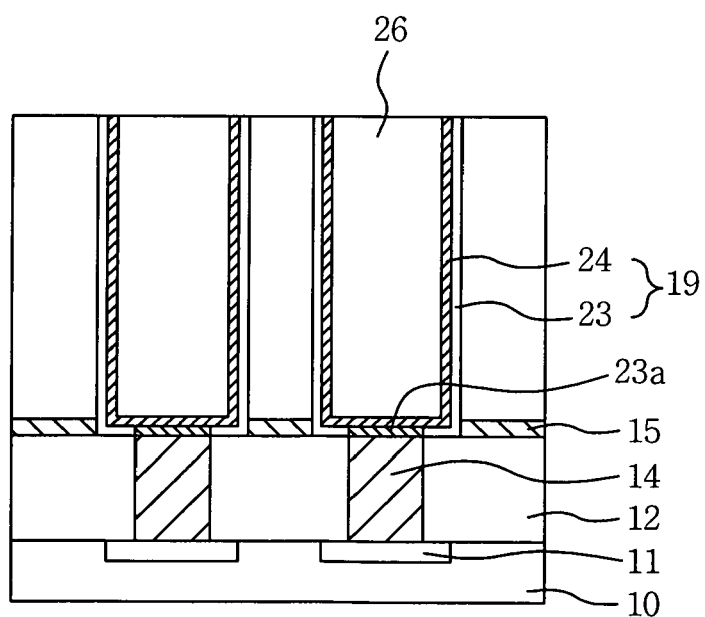
Figure 1G:
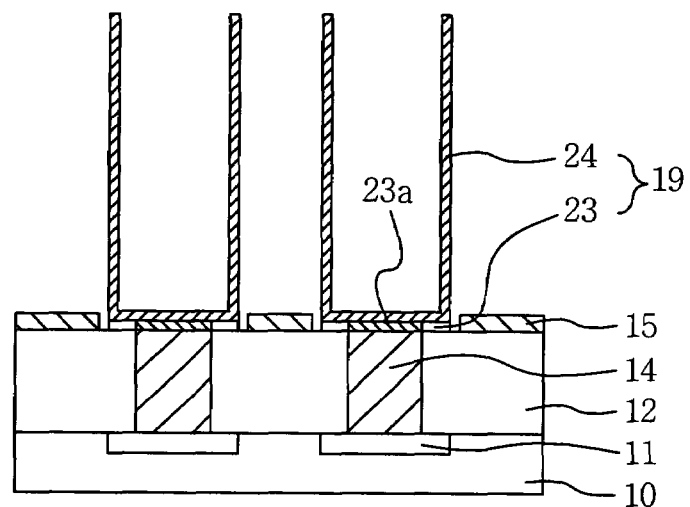
Figure 1H:
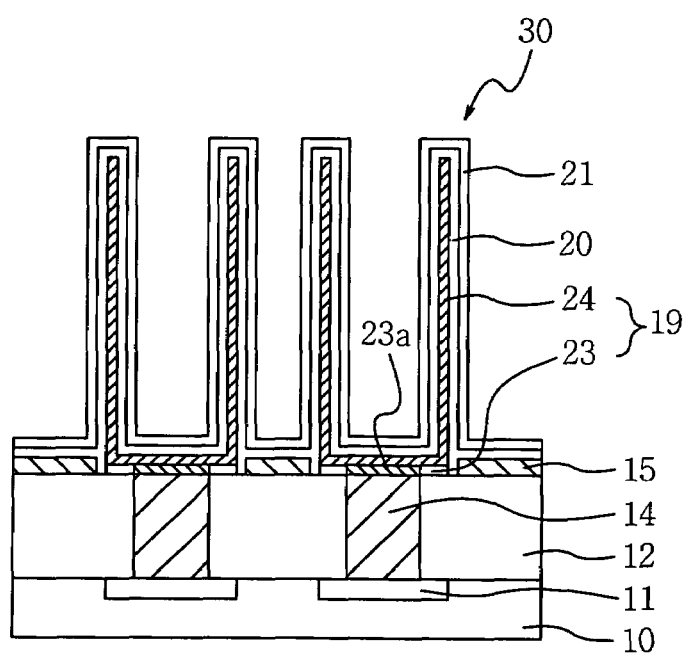

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
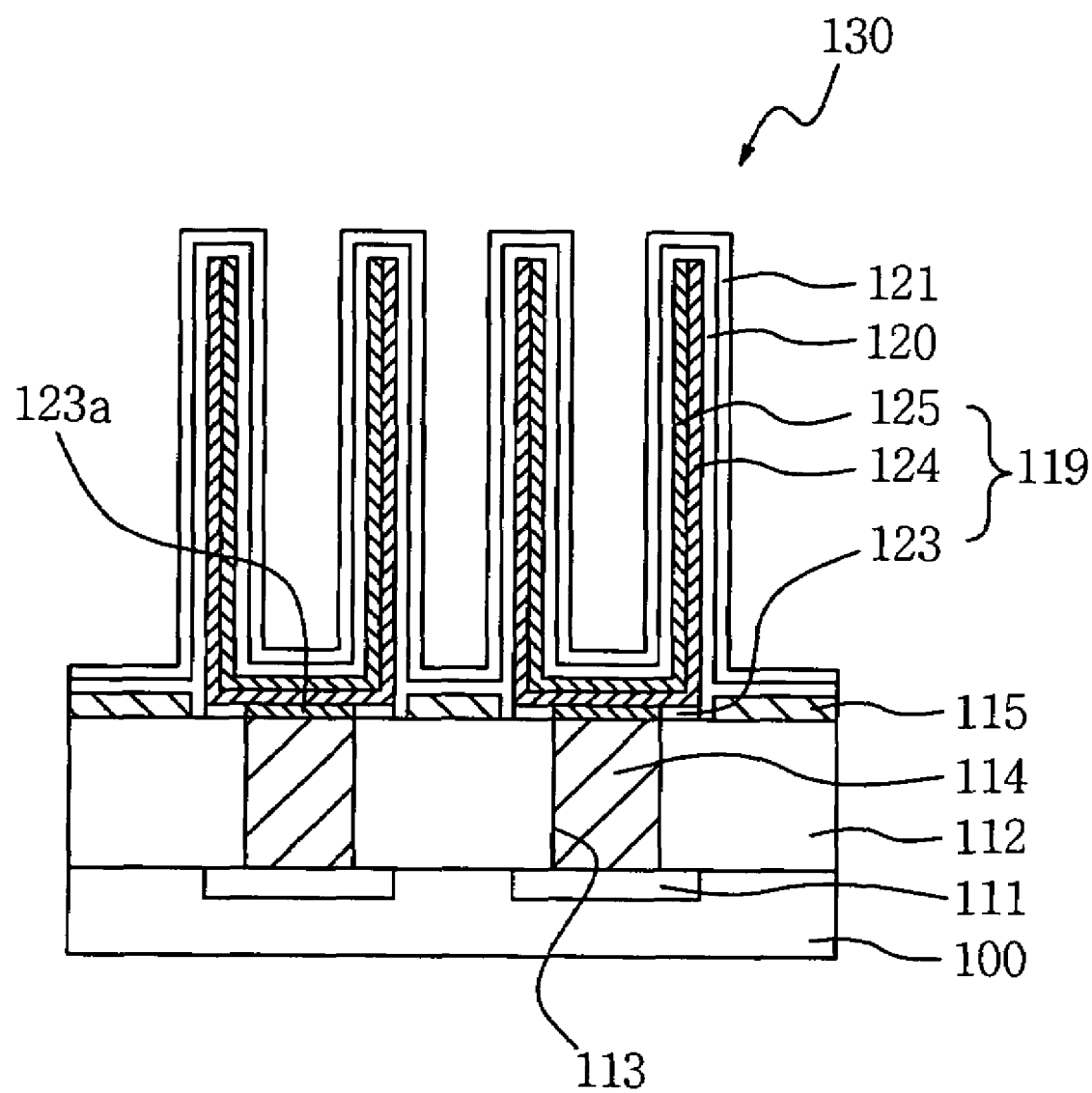
FIG. 2 is a sectional view of a storage capacitor according to some embodiments of the invention.

FIG. 2 is a sectional view of storage capacitor 130 according to some embodiments of the invention.

Referring to FIG. 2, a semiconductor device according to some embodiments of the invention includes a conductive region 111 formed on a semiconductor substrate 100, a first interlayer insulation layer 112 formed on the semiconductor substrate 100 and/or the conductive region 111, and a contact plug 114 that is formed within a contact hole 113 that extends through the first interlayer insulation layer 112. The contact plug 114 may be electrically connected to the conductive region 111, and may be formed of a conductive silicon-containing material such as doped polysilicon. A generally cylindrical storage electrode 119 includes at least one titanium oxide nitride (TiON) layer 125 formed within and/or on a titanium nitride layer (TiN) 124. The titanium nitride layer 124 is formed on a titanium layer 123, which is formed on the contact plug 114. Portions of the titanium layer 123 may react with silicon in the contact plug 114 to form a titanium silicide layer 123a. A dielectric layer 120 and a plate electrode 121 are formed on the storage electrode 119 to complete the storage capacitor 130.

The conductive region 111 may include a region doped with a conductive impurity on the semiconductor substrate 100 in a memory device such as, for example, a DRAM (Dynamic Random Access Memory) cell. The conductive region 111 may form a source/drain region of a transistor formed on the semiconductor substrate 100, and/or may form a contact pad that is electrically connected to a source/drain region.

At least one titanium oxide nitride layer 125 may be formed on or within the titanium nitride layer 124 as described in more detail below. In particular, the titanium nitride layer 124 may be formed to have an overall thickness of about 300 Å, and the titanium oxide nitride layer 125 may be formed on or within the titanium nitride layer 124 to have thickness of about 10 Å to about 30 Å. Thus, the titanium oxide nitride layer 125 may impede or prevent a buffer solution used to remove a molding oxide layer and/or a sacrificial oxide layer used in forming the storage electrode 119, from penetrating through the titanium nitride layer 124, thus protecting the titanium layer 123, the titanium silicide layer 123a, and/or the contact plug 114.

Figure 3:
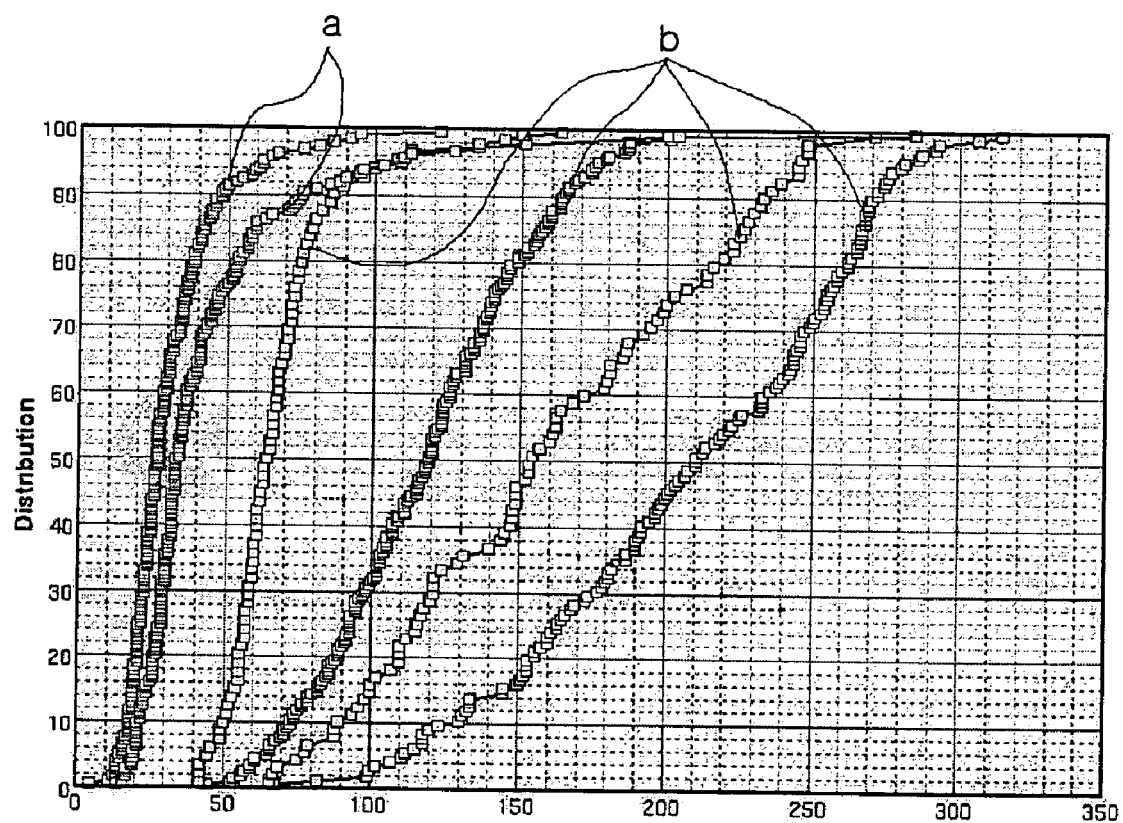
FIG. 3 is a graph comparing a single bit defect distribution for DRAM cells using a storage capacitor according to some embodiments of the invention with a single bit defect distribution for DRAM cells using a conventional storage capacitor.

FIG. 3 is a graph comparing a single bit defect distribution for DRAM cells using a storage capacitor according to some embodiments of the invention with a single bit defect distribution for DRAM cells using a conventional storage capacitor. It may be noted that a storage capacitor (a) obtained by forming a titanium oxide nitride layer 125 on the titanium nitride layer 124 based on an some embodiments of the invention may be superior to a storage capacitor (b) employing a conventional titanium nitride layer.

The capacitance of a storage capacitor formed according to some embodiments of the invention was measured using a storage electrode having a structure of titanium/titanium nitride/titanium oxide nitride. The capacitance of a conventional storage capacitor was measured using a storage electrode having a structure of titanium/titanium nitride. Distributions of single bit defects in respective DRAMs are compared with one another on the basis of about 50%.

As discussed above, in a storage capacitor according to some embodiments of the invention, the storage electrode 119 may include at least one titanium oxide nitride layer 125 formed on or within the titanium nitride layer 124. Thus, a buffer solution used to remove a molding oxide layer and/or a sacrificial oxide layer used in forming the storage electrode 119 may be impeded or prevented from penetrating through the titanium nitride layer 124 and attacking the titanium layer 123, the titanium silicide layer 123a and/or the contact plug 114 formed beneath the titanium nitride layer 124.

Methods of forming storage capacitors according to some embodiments of the invention will now be described.

Figure 4A:
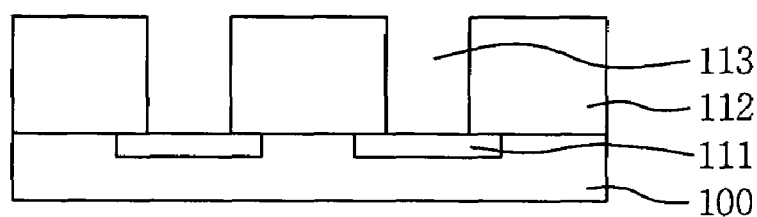
FIGS. 4A through 4H are sectional views illustrating methods of forming storage capacitors according to some embodiments of the invention.
Figure 4B:
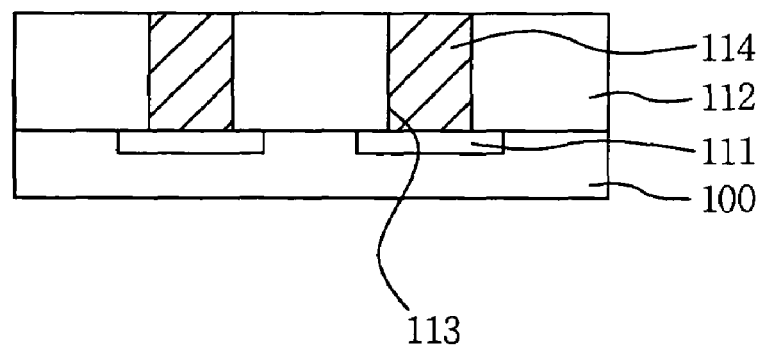
Figure 4C:
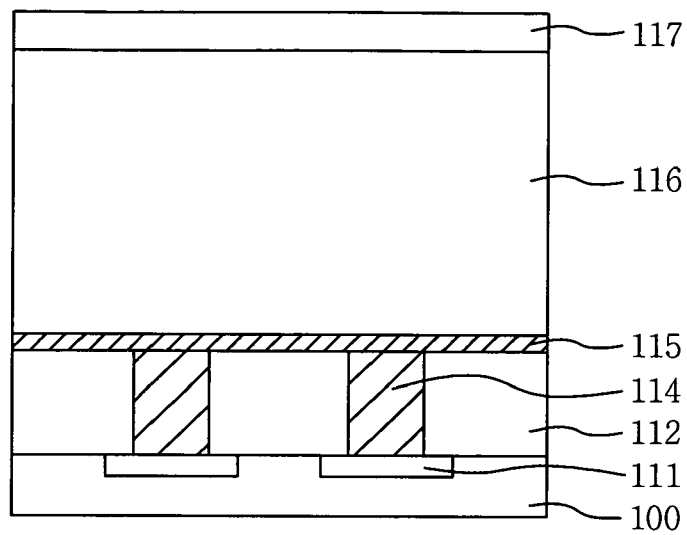
Figure 4D:
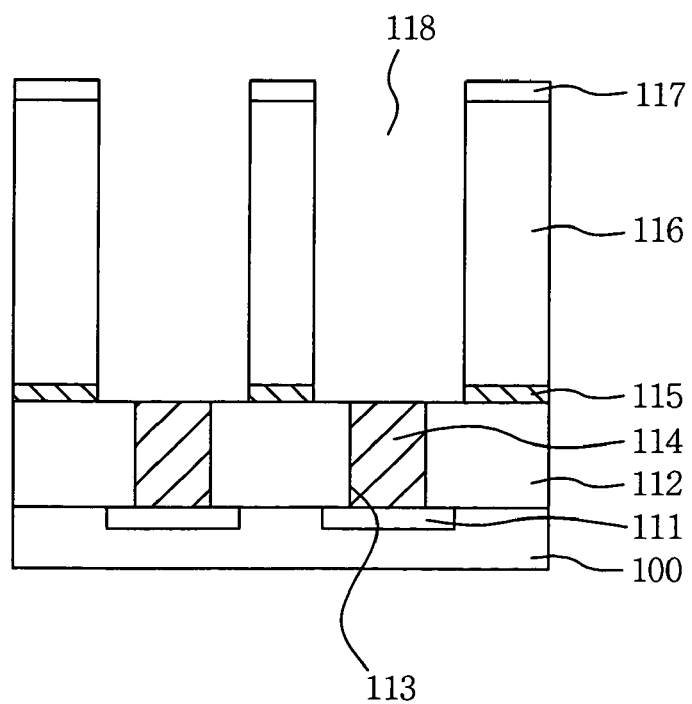
Figure 4E:
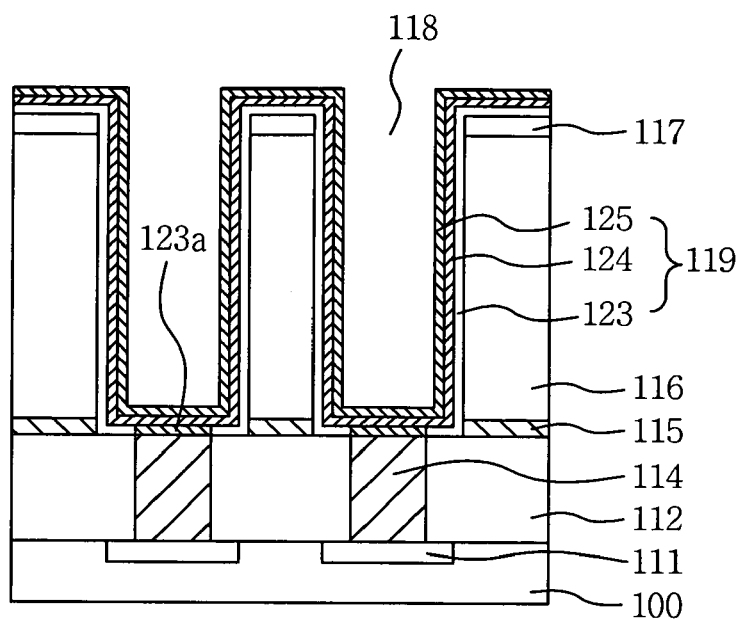
Figure 4F:
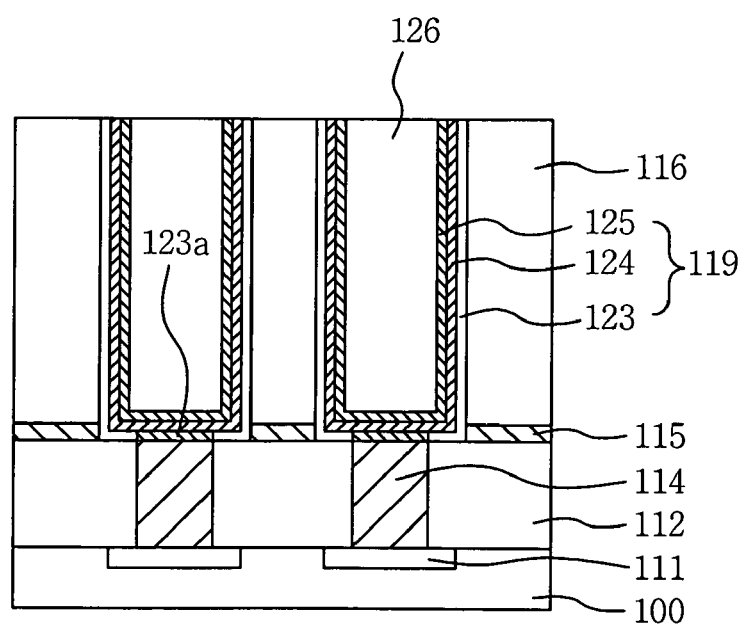
Figure 4G:
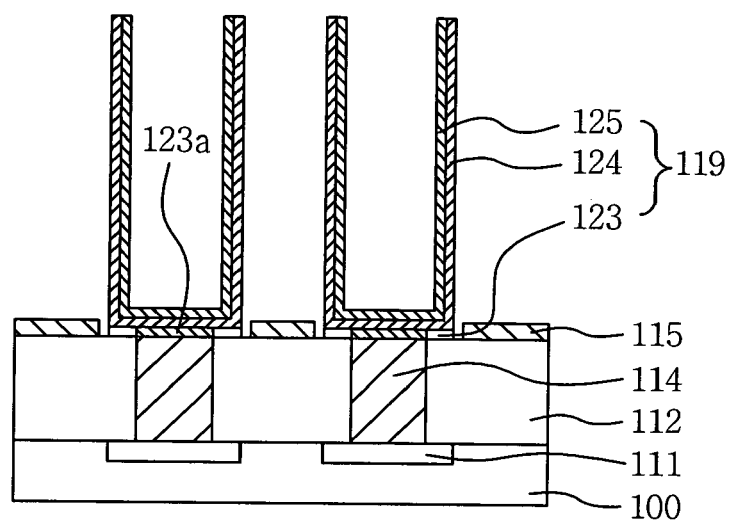
Figure 4H:
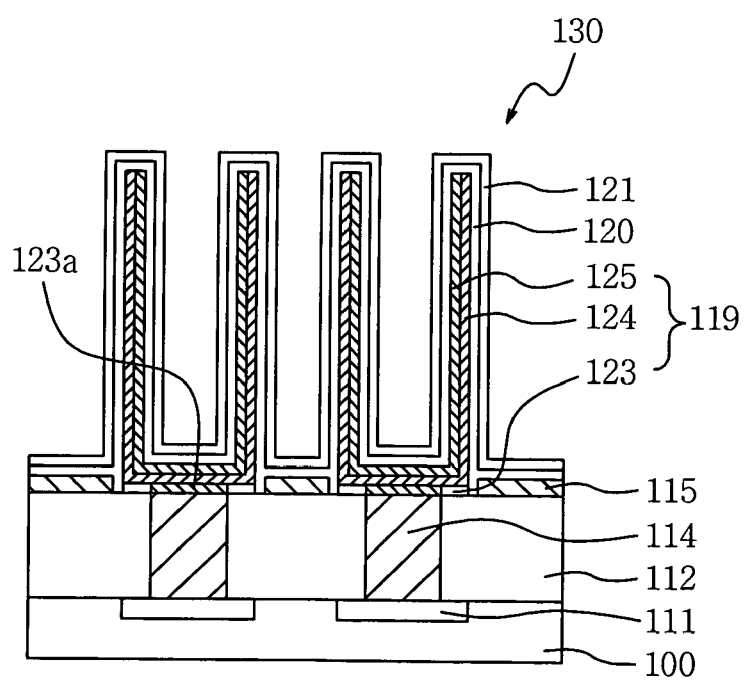
Figure 5:
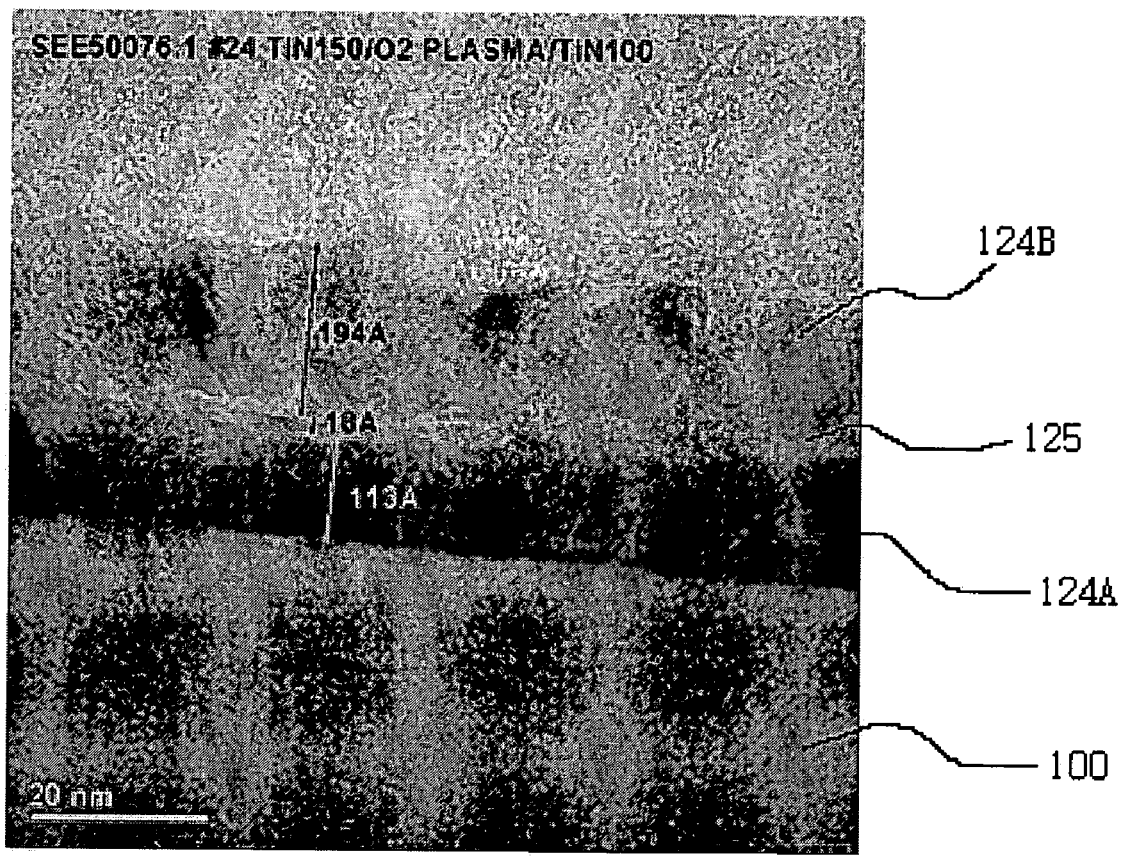
FIG. 5 is a TEM (Transmission Electron Microscopy) photograph illustrating a section of the storage electrode shown in FIG. 4G.
Figure 6A:
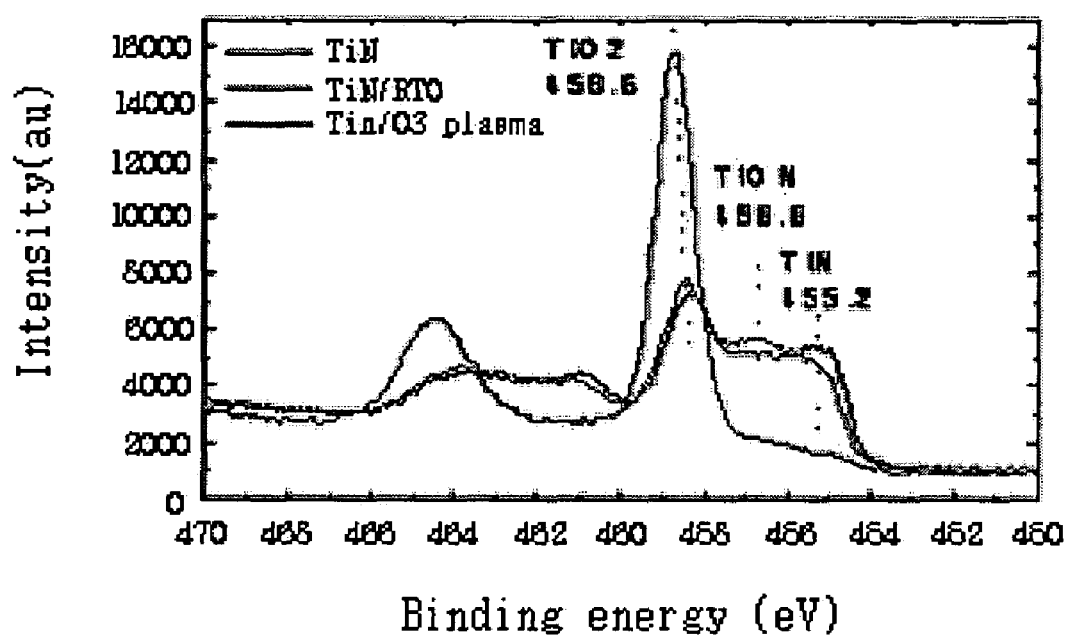
FIGS. 6A to 6C are graphs of XPS analysis results for a titanium oxide nitride layer formed inside a titanium nitride layer of FIG. 5.
Figure 6B:
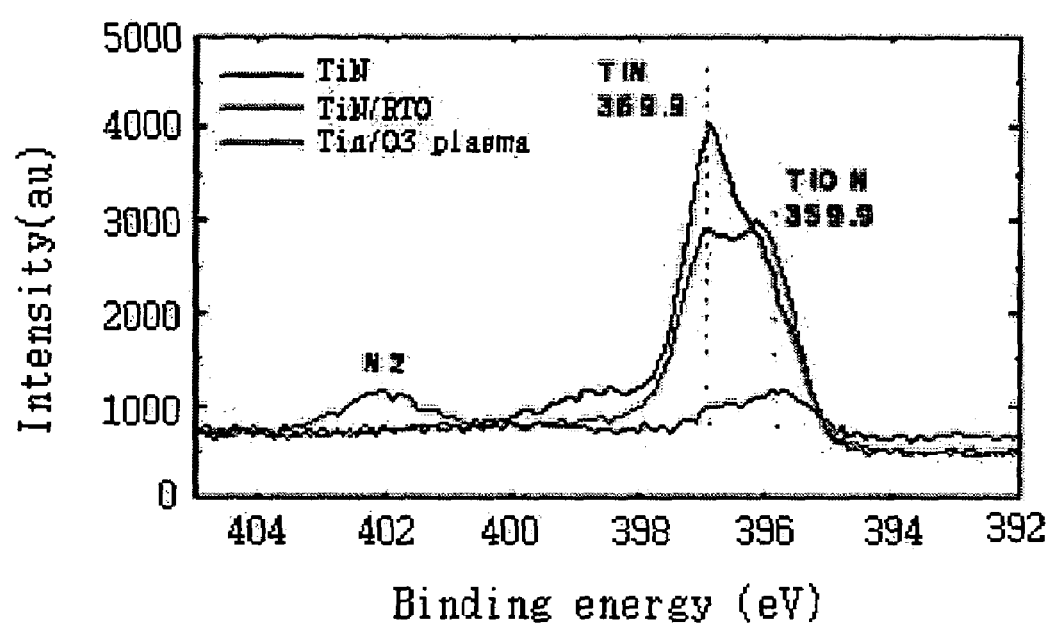
Figure 6C:
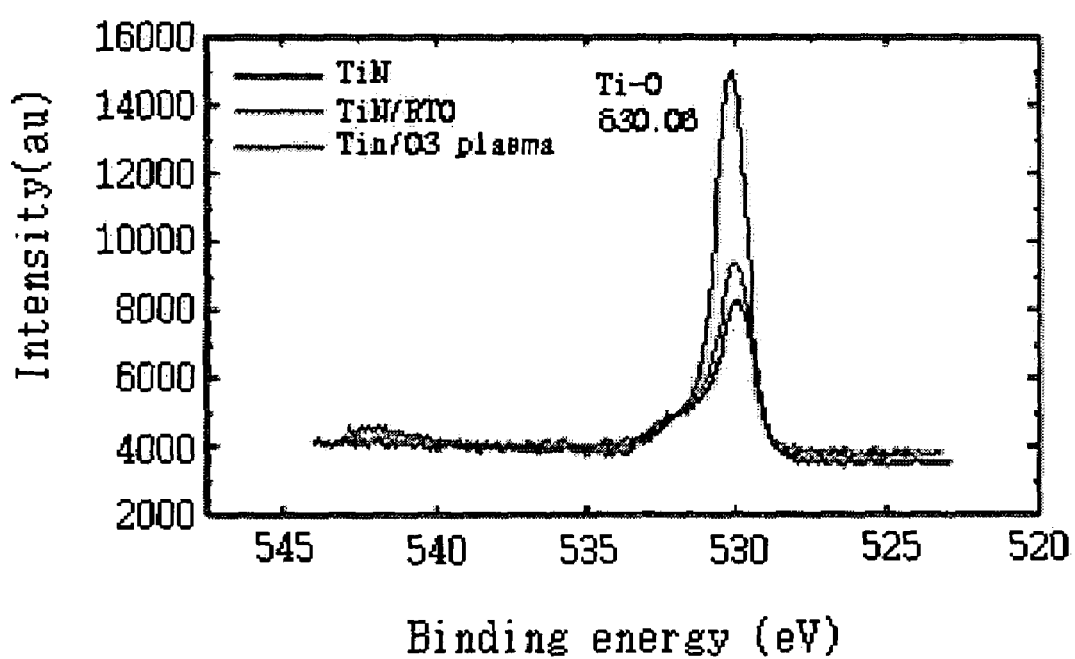
Figure 7:
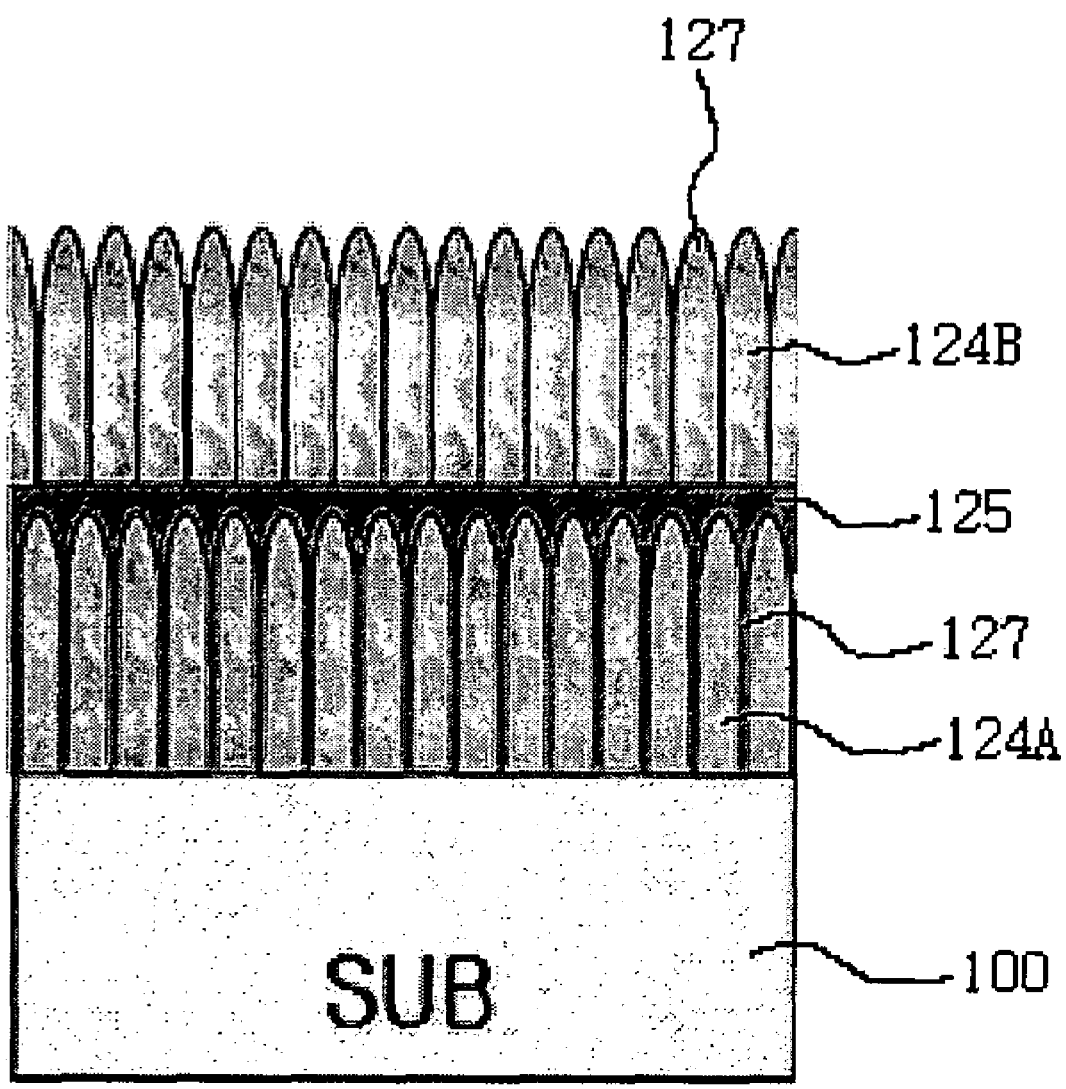
FIG. 7 is a sectional view schematically illustrating a titanium nitride layer and a titanium oxide nitride layer shown in FIG. 5.

FIGS. 4A through 4H are sectional views illustrating methods of forming storage capacitors according to some embodiments of the invention, and FIG. 5 is a TEM (Transmission Electron Microscopy) photograph illustrating a section of a storage electrode shown in FIG. 4G. FIGS. 6A to 6C are graphs of XPS analysis results for a titanium oxide nitride layer 125 formed inside a titanium nitride layer 124 according to some embodiments of the invention, as illustrated in FIG. 5. FIG. 7 is a sectional view schematically illustrating a titanium nitride layer 124 and a titanium oxide nitride layer 125 formed within the titanium nitride layer 124 according to some embodiments of the invention, as shown in FIG. 5.

Referring to the embodiments of FIG. 4A, a first interlayer insulation layer 112 may be formed on a semiconductor substrate 100 and/or on a conductive region 111 on the semiconductor substrate 100. Portions of the interlayer insulation layer 112 may be selectively removed to expose portions of the semiconductor substrate 100 and/or the conductive region 111 to form a contact hole 113 extending through the first interlayer insulation layer 112 to the substrate 100. The first interlayer insulation layer 112 may be formed of silicon oxide, for example, through a chemical vapor deposition (CVD) process. In some embodiments, the first interlayer insulation layer 112 may include one or more silicon oxide layers having an aggregate thickness of about 3000 Å to about 9000 Å. The contact hole 113 may be formed, for example, by covering an upper part of the first interlayer insulation layer 112 with photoresist (not shown), patterning the photoresist through a photolithography process, and dry-etching the first interlayer insulation layer 112 using the patterned photoresist layer as an etch mask.

Referring to the embodiments of FIG. 4B, a layer of polysilicon containing conductive impurities is formed, for example through a CVD process, over the semiconductor substrate 100 and the interlayer insulation layer 112 including the contact hole 113. The polysilicon layer may be partially removed to expose the first interlayer insulation layer 112, for example, through a chemical mechanical polishing (CMP) method, leaving a contact plug 114 inside the contact hole 113. Though not shown in the drawings, a silicon nitride spacer layer may be formed on a sidewall of the contact hole 113 before forming the contact plug 114, so as to reduce or prevent electrical coupling between various lines, such as bit lines, in the structure.

With reference to the embodiments of FIG. 4C, a silicon nitride etch stop layer 115 may be formed on the contact plug 114 and the first interlayer insulation layer 112, and a molding oxide layer 116 may be formed using silicon oxide on the etch stop layer 115. A hard mask layer 117 may be formed on the molding oxide layer 116. The hard mask layer 117 may include, for example, silicon nitride formed through a CVD process. The etch stop layer 115 and the hard mask layer 117 may each be formed to have thickness of about 200 Å to about 1000 Å, and the molding oxide layer 116 may be formed to have thickness of about 15,000 Å to about 20,000 Å. In particular embodiments, the molding oxide layer 116 may have a thickness of about 18,000 Å.

As shown in the embodiments of FIG. 4D, portions of the molding oxide layer 116 and the hard mask layer 117 may be removed to form a recess 118. In particular, a photoresist pattern (not shown) may be formed on the hard mask layer 117 and patterned using a photolithography process, and the hard mask layer 117 may be etched by using the photoresist pattern as an etch mask. The photoresist pattern may then be removed, and the molding oxide layer 116 may be selectively etched using the hard mask layer 117 as an etch mask, thus forming a recess 118. The etch stop layer 115 may be removed to expose the contact plug 114. In some embodiments, the hard mask layer 117 may be removed together with the etching of the molding oxide layer 116 and/or the etch stop layer 115.

As shown in FIG. 4E, a storage electrode 119 may be formed by forming a titanium layer 123, a titanium nitride layer 124 and a titanium oxide nitride layer 125 on an entire face of the semiconductor substrate 100 including within the recess 118. In particular, the titanium layer 123 may be formed within the recess 118 above the contact plug 114. Portions of the titanium layer 123 may react with silicon in the contact plug 114 to form a titanium silicide layer 123a. A titanium nitride layer 124 may be formed on the titanium layer 123 and the titanium silicide layer 123a, and a titanium oxide nitride layer 125 may be formed on and/or within the titanium nitride layer 124. The titanium oxide nitride layer 125 is formed on or within the titanium nitride layer 124, so that the titanium layer 123 under the titanium nitride layer 124, the titanium silicide layer 123a, and/or the silicon contact plug 114 may be protected by the titanium oxide nitride layer 125 from buffer solutions used in subsequent processing steps.

The titanium layer 123 may be formed, for example, using a CVD process and/or plasma enhanced CVD process in which $TiCl_4$ gas and $H_2$ may be used as source gases. For example, the titanium layer 123 may have a thickness of about 100 Å to about 150 Å. In forming the titanium layer 123 using a CVD process, a high temperature thermal process may be used to form the titanium silicide layer 123a in an interface of the silicon-containing contact plug 114 and the titanium layer 123, which may cause some damage to the device structure beneath the contact plug 114. Thus, the titanium layer 123 may in some embodiments be formed through a plasma enhanced CVD process, which may be performed at a relatively low temperature. In a plasma enhanced CVD process, energy reacting between the titanium layer 123 and the silicon of the contact plug 114 is provided in an interface between the titanium layer 123 and the contact plug 114, thereby forming a titanium silicide layer 123a.

The titanium nitride layer 124 may be formed, for example, by a CVD process in which $TiCl_4$ gas and $NH_3$ gas may be used as source gases. In further embodiments, the titanium nitride layer 124 may be formed through an atomic layer deposition (ALD) and/or a plasma-enhanced CVD process.

The titanium nitride layer 124 may be formed to have a thickness of about 10 Å to about 500 Å. In particular, the titanium nitride layer 124 may be formed with a thickness of about 300 Å, with the titanium oxide nitride layer 125 formed within the titanium nitride layer 124 or on the titanium nitride layer 124. Material formed through a CVD process and/or a plasma enhanced CVD process may have a good step coverage. Thus, the titanium nitride layer 124 and the titanium layer 123 formed on the sidewalls and bottom of the recess 118 may have relatively uniform thicknesses.

In some embodiments of the invention, the titanium oxide nitride layer 125 may be formed through a rapid thermal process (RTP), a plasma oxidation ($O_2$ plasma), a tube $O_2$ diffusion method and/or an in-situ oxidation method in a chemical vapor deposition system.

For example, the titanium oxide nitride layer 125 may be formed through an RTP process, such as a rapid thermal oxidation (RTO) process in which the titanium nitride layer 124 is rapidly thermal-processed in an atmosphere of oxygen and/or through a rapid thermal nitridation (RTN) process in which the titanium nitride layer 124 is rapidly thermal-processed in an atmosphere of nitrogen with a flow of oxygen. In some embodiments, the titanium oxide nitride so formed may be amorphous.

Referring to the embodiments of FIG. 4F, a sacrificial oxide layer 126 may be formed on the semiconductor substrate 100 to bury the titanium oxide nitride layer 125 and the recess 118 in which the titanium nitride layer 124 is formed. Portions of the sacrificial oxide layer 126, the titanium oxide nitride layer 125, the titanium nitride layer 124 and the titanium layer 123 may be removed, for example, by planarizing the substrate 100 using, for example, a CMP or etch-back process, to expose the molding oxide layer 116, thus separating nodes of the storage electrode 119.

With reference to FIG. 4G, the sacrificial oxide layer 126 and the molding oxide layer 116 may be removed by using a buffer solution, e.g., a LAL solution in which $HF:NH_4F$ are mixed at a ratio of about 1:5~1:10. A cylindrical storage electrode 119 may thereby be formed. The buffer solution may not penetrate the amorphous titanium oxide nitride layer 125. In other words, the titanium layer 123, the titanium silicide layer 123a and the silicon-containing contact plug 114, which are beneath the titanium oxide nitride layer 125, may not be damaged by the buffer solution. Further, the buffer solution may etch the exposed titanium layer 123, but not the titanium silicide layer 123a and the portions of the titanium layer 123 provided beneath the titanium nitride layer 124.

As shown in FIG. 4H, a dielectric layer 120 may be formed on the storage electrode 119, and a plate electrode 121 may be formed on the dielectric layer 120, thereby completing the formation process of the storage capacitor 130.

The dielectric layer 120 may include a plurality of dielectric layers 120 including at least one material having a high dielectric constant such as, for example, $Al_2O_3$ and/or $HfO_2$. The plate electrode 121 may include a metal such as titanium nitride and/or may contain a conductive material such as polysilicon and/or tungsten silicide.

A second interlayer insulation layer (not shown) of silicon oxide and/or silicon nitride may be formed to bury the storage capacitor.

Methods of forming a titanium oxide nitride layer 125 within a titanium nitride layer 124 through RTO will now be described with reference to FIG. 5. For example, first, a titanium nitride layer 124A having thickness of, for example, about 130 Å may be formed through a CVD process. The titanium nitride layer 124 may be processed in an RTP system at about 500° C. to rapidly oxidize an exposed portion of the titanium nitride layer 124, and thereby form a titanium oxide nitride layer 125 having a thickness of, for example, about 18 Å on the titanium nitride layer 124. In some embodiments, a second titanium nitride layer 124B having a thickness of, for example, about 194 Å may be formed on the titanium oxide nitride layer 125 through a CVD process. The titanium nitride layer 124 may include the first titanium nitride layer 124A and the second titanium nitride layer 124B. Thus, in the embodiments illustrated in FIG. 5, the titanium nitride oxide layer 125 is formed within the titanium nitride layer 124. The titanium nitride layer 124 may have a polycrystalline material structure having a grain size of about 100 Å, while the titanium oxide nitride layer 125 formed through the RTP process may be amorphous.

The existence of the titanium oxide nitride layer 125 on the titanium layer 123 and the titanium nitride layer 124 may be confirmed as shown in FIGS. 6A-6C. In the graphs of FIGS. 6A-6C, transverse axes of respective graphs indicate binding energy of respective elements, and longitudinal axes indicate intensity. FIG. 6A illustrates a peak of binding energy of the titanium oxide nitride layer 125 at about 456.6 eV, FIG. 6B illustrates a peak of binding energy of the titanium oxide nitride layer 125 at about 359.9 eV, and FIG. 6C illustrates a peak of binding energy of titanium and oxygen at about 530.08 eV.

Referring to FIG. 7, a titanium oxide nitride layer 125 may be formed among a plurality of polycrystalline titanium nitride grains 134. Accordingly, grain boundaries 127 formed between the plurality of polycrystalline titanium nitride grains 134 may not be connected with one another. Thus, when wet etching the molding oxide layer 116 and the sacrificial oxide layer 124 using a buffer solution, the titanium silicide layer and the contact plug beneath the titanium nitride layer 124 may be protected from being harmed by penetration of the buffer solution along a grain boundary 127 of the titanium nitride layer 124.

Therefore, referring again to FIG. 2 or 4H, methods of forming a storage capacitor according to some embodiments of the invention may reduce or prevent damage to the titanium silicide layer 123, and/or the contact plug 114 caused by penetration of the buffer solution through the titanium nitride layer 124, by forming at least one titanium oxide nitride layer 125 within and/or on the titanium nitride layer 124.

The titanium oxide nitride layer 125 may be formed in such a manner that the semiconductor substrate 100 on which the titanium nitride layer 124 is formed is partially exposed in the atmosphere so as to form a titanium oxide nitride layer 125 as a natural oxide layer on the titanium nitride layer 124. Formation of the titanium nitride layer 124 may then be continued on the titanium oxide nitride layer 125.

In order to form the titanium nitride oxide layer 125, a vacuum break method may be used. That is, the semiconductor substrate 100 on which a titanium nitride layer 124 is formed in a vacuum may be partially exposed to the atmosphere, thus forming a titanium oxide nitride layer 125 thereon. When the titanium nitride layer 124 is exposed in the atmosphere for about five minutes, an amorphous titanium oxide nitride layer 125 having a thickness of about 10 Å may be formed on the titanium nitride layer 124. The semiconductor substrate 100 may be again provided within the chamber to continue the formation of the titanium nitride layer 124.

As described above, in methods of forming a storage capacitor according to some embodiments of the invention, a storage electrode 119 may include at least one titanium oxide nitride layer 125 formed within and/or on a titanium nitride layer 124, which is on a titanium layer 123 and/or a titanium silicide layer 123a. A buffer solution used to remove a molding oxide layer 116 and/or a sacrificial oxide layer 126 used in forming the storage electrode 119, may be impeded and or prevented from penetrating through the titanium nitride layer 124 and attacking the titanium silicide layer 123a and/or a contact plug 114 beneath the titanium silicide layer 123a. Accordingly, production yields for semiconductor memory devices including storage capacitors so formed may be increased.

As described above, according to some embodiments of the invention, a storage electrode may be formed including at least one titanium oxide nitride layer formed on and/or within a titanium nitride layer. A buffer solution used to remove a molding oxide layer and/or a sacrifice oxide layer used in forming the storage electrode may be impeded and/or prevented from penetrating through the titanium nitride layer, thereby protecting a titanium silicide layer and/or a contact plug beneath the titanium nitride layer from damage.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a storage capacitor, comprising:
   forming an interlayer insulation layer on a semiconductor substrate, the interlayer insulation layer including an opening therein extending to the semiconductor substrate;
   forming a contact plug in the opening in the interlayer insulation layer;
   forming a molding oxide layer on the interlayer insulation layer and the contact plug;
   selectively removing portions of the molding oxide layer to form a recess above the contact plug, the recess having a bottom surface and side surfaces;
   forming a titanium layer on the bottom surface and the side surfaces of the recess;
   forming a titanium oxide nitride layer on the titanium layer; and
   forming a titanium nitride layer on the titanium layer, wherein forming a forming a titanium oxide nitride layer on the titanium layer comprises forming a titanium oxide nitride layer on the titanium nitride layer.

2. The method of claim 1, further comprising:
   forming a sacrificial oxide layer on the semiconductor substrate including the recess;
   planarizing the semiconductor substrate to expose the molding oxide layer and thereby define a storage electrode;
   removing the sacrificial oxide layer and the molding oxide layer;
   forming a dielectric layer on the storage electrode; and
   forming a plate electrode on the dielectric layer.

3. The method of claim 1, wherein the titanium nitride layer has a thickness of about 300 Å.

4. The method of claim 1, wherein the titanium oxide nitride layer is formed by rapidly thermal-processing the titanium nitride layer in an atmosphere of oxygen.

5. The method of claim 1, wherein the titanium oxide nitride layer is formed by rapidly thermal-processing the titanium nitride layer in an atmosphere of nitrogen with a flow of oxygen.

6. The method of claim 1, wherein the titanium oxide nitride layer is formed by a vacuum break method in which the titanium nitride layer is formed in a vacuum state and is exposed to the atmosphere.

7. The method of claim 6, wherein the titanium oxide nitride layer is formed by exposing the titanium nitride layer in the atmosphere for about five minutes, to thereby form a titanium oxide nitride layer having a thickness of about 10 Å.

8. The method of claim 1, wherein forming the titanium nitride layer comprises forming a first titanium nitride layer and forming the titanium oxide nitride layer comprises forming a titanium oxide nitride layer on the first titanium nitride layer, the method further comprising forming a second titanium nitride layer on the titanium oxide nitride layer.

9. A method of forming a storage capacitor, comprising:
   forming an interlayer insulation layer on a semiconductor substrate, the interlayer insulation layer including an opening therein extending to the semiconductor substrate;
   forming a contact plug in the opening in the interlayer insulation layer;
   forming a molding oxide layer on the interlayer insulation layer and the contact plug;
   selectively removing portions of the molding oxide layer to form a recess above the contact plug, the recess having a bottom surface and side surfaces;
   forming a titanium layer on the bottom surface and the side surfaces of the recess; and
   forming a titanium oxide nitride layer on the titanium layer;
   wherein the titanium oxide nitride layer has a thickness of from about 10 Å to about 30 Å; and
   wherein the titanium oxide nitride layer is formed through a rapid thermal process, a plasma oxidation, a tube $0_2$ diffusion and/or an in-situ oxidation.

10. The method of claim 9, wherein the titanium oxide nitride layer is formed at a temperature under about 500° C.

* * * * *

UNITED STATES PATENT AND TRADEMARK OFFICE
CERTIFICATE OF CORRECTION

PATENT NO. : 7,364,967 B2  Page 1 of 1
APPLICATION NO. : 11/266520
DATED : April 29, 2008
INVENTOR(S) : Kim et al.

It is certified that error appears in the above-identified patent and that said Letters Patent is hereby corrected as shown below:

In the Claims:

Column 12, Claim 1, Line 2: Please correct "wherein forming a forming a"
To read -- wherein forming a --

Signed and Sealed this

Twenty-sixth Day of August, 2008

JON W. DUDAS
*Director of the United States Patent and Trademark Office*